(12) United States Patent
Kong et al.

(10) Patent No.: US 10,079,158 B2
(45) Date of Patent: Sep. 18, 2018

(54) VERTICAL TRENCH ROUTING IN A SUBSTRATE

(71) Applicant: Intel Corporation, Santa Clara, CA (US)

(72) Inventors: Jackson Kong, Tanjung Tokong (MY); Bok Eng Cheah, Penang (MY); Khang Choong Yong, Puchong (MY); Howard L. Heck, Hillsboro, OR (US); Kuan-Yu Chen, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 337 days.

(21) Appl. No.: 14/569,438

(22) Filed: Dec. 12, 2014

(65) Prior Publication Data

US 2016/0174374 A1 Jun. 16, 2016

(51) Int. Cl.
*H05K 7/00* (2006.01)
*H01P 3/08* (2006.01)
*H01L 21/48* (2006.01)
*H01L 23/498* (2006.01)
*H01L 23/00* (2006.01)
(Continued)

(52) U.S. Cl.
CPC ........ *H01L 21/486* (2013.01); *H01L 21/4857* (2013.01); *H01L 23/49822* (2013.01); *H01L 23/49827* (2013.01); *H01L 24/10* (2013.01); *H01P 3/082* (2013.01); *H05K 1/0224* (2013.01); *H05K 1/0245* (2013.01); *H01L 21/4846* (2013.01); *H01P 3/003* (2013.01); *H01P 3/026* (2013.01); *H01P 3/04* (2013.01);
(Continued)

(58) Field of Classification Search
CPC .. H01P 3/003; H01P 3/026; H01P 3/08; H01P 5/028; H01P 3/04; H05K 1/0242; H05K 1/0245
USPC ......... 333/238, 246; 361/777; 174/250, 254, 174/261
See application file for complete search history.

(56) References Cited

U.S. PATENT DOCUMENTS

2005/0237137 A1    10/2005    Dutta
2006/0028305 A1    2/2006     Dutta
(Continued)

FOREIGN PATENT DOCUMENTS

KR          100573494         4/2006

OTHER PUBLICATIONS

PCT International Search Report for counterpart PCT Application No. PCT/US2015/060444, 9 pages, (dated Nov. 12, 2015).
(Continued)

*Primary Examiner* — Binh Tran
(74) *Attorney, Agent, or Firm* — Womble Bond Dickinson (US) LLP

(57) ABSTRACT

An interconnect topology that includes vertical trench routing in a substrate is disclosed. In one embodiment, the interconnect comprises a substrate having a plurality of layers including a first ground plane layer; a pair of signal conductors that form a differential signal pair, each conductor of the pair of signal conductors having a first portion and a second portion, the second portion extending from the first portion into at least one of the plurality of layers, wherein width of the second portion is less than width of the first portion; and wherein the first ground plane layer is only a first partial layer and has a first void region that is closer to the pair of signal conductors than the first partial layer.

17 Claims, 11 Drawing Sheets

(51) Int. Cl.
| | |
|---|---|
| H05K 1/00 | (2006.01) |
| H05K 1/11 | (2006.01) |
| H01P 3/00 | (2006.01) |
| H01P 3/02 | (2006.01) |
| H01P 5/02 | (2006.01) |
| H05K 1/02 | (2006.01) |
| H01P 3/04 | (2006.01) |

(52) U.S. Cl.
CPC ............... *H01P 3/08* (2013.01); *H01P 5/028* (2013.01); *H05K 1/0242* (2013.01); *H05K 2201/0376* (2013.01)

(56) References Cited

U.S. PATENT DOCUMENTS

| | | | |
|---|---|---|---|
| 2009/0072930 A1 | 3/2009 | Dutta | |
| 2011/0019371 A1* | 1/2011 | Hsu | H05K 1/0245 |
| | | | 361/749 |
| 2013/0009729 A1 | 1/2013 | Kim | |
| 2015/0055307 A1* | 2/2015 | Shaw | H05K 1/0253 |
| | | | 361/748 |

OTHER PUBLICATIONS

International Preliminary Report on Patentability for International Appln. No. PCT/US2015/060444, dated Jun. 13, 2017, 5 pgs.

* cited by examiner

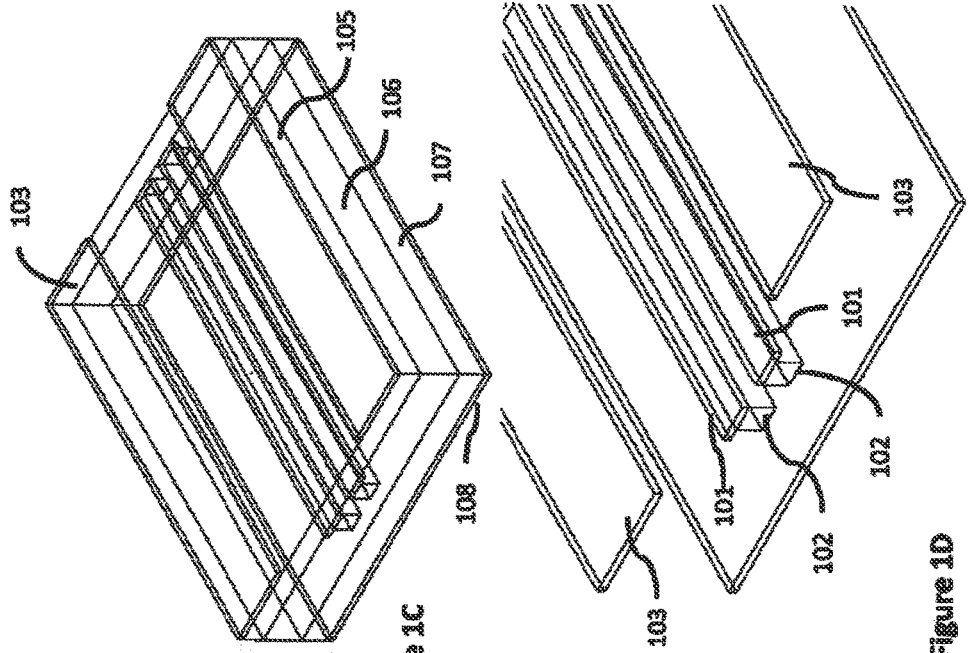
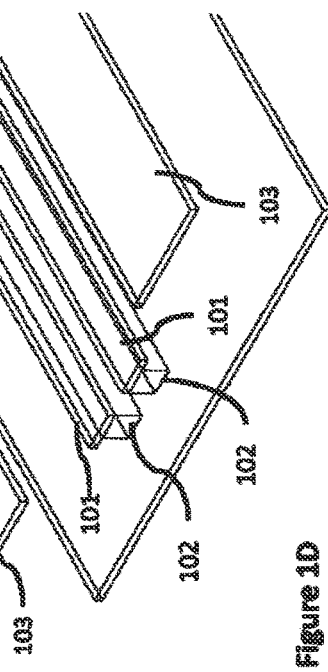
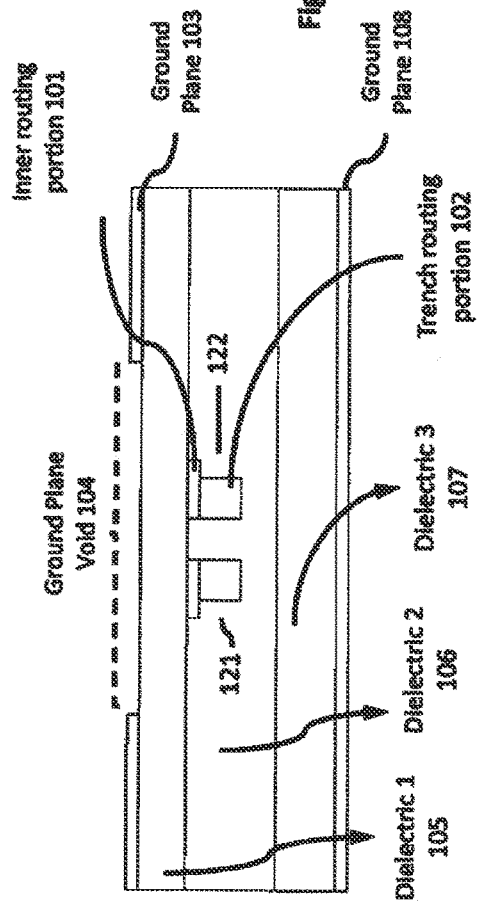
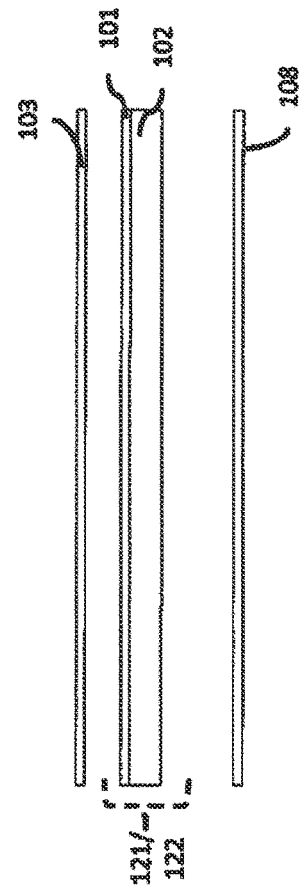

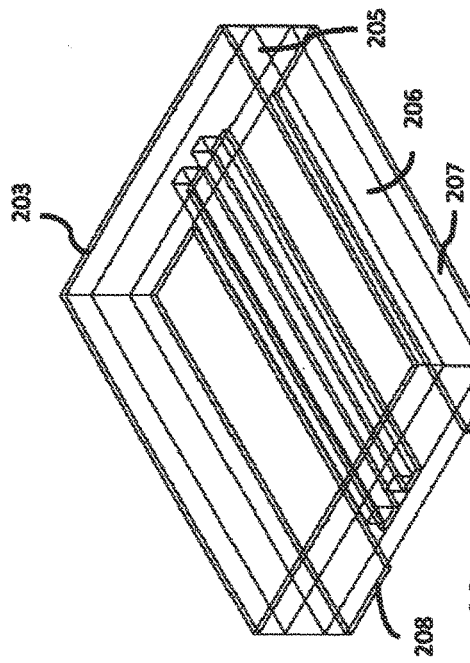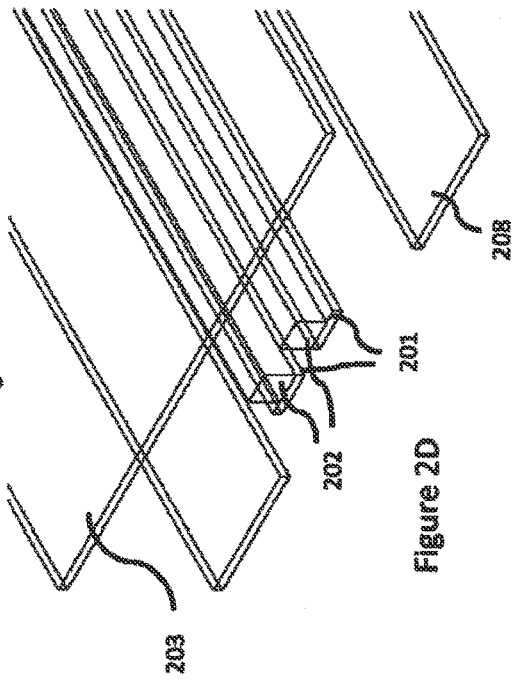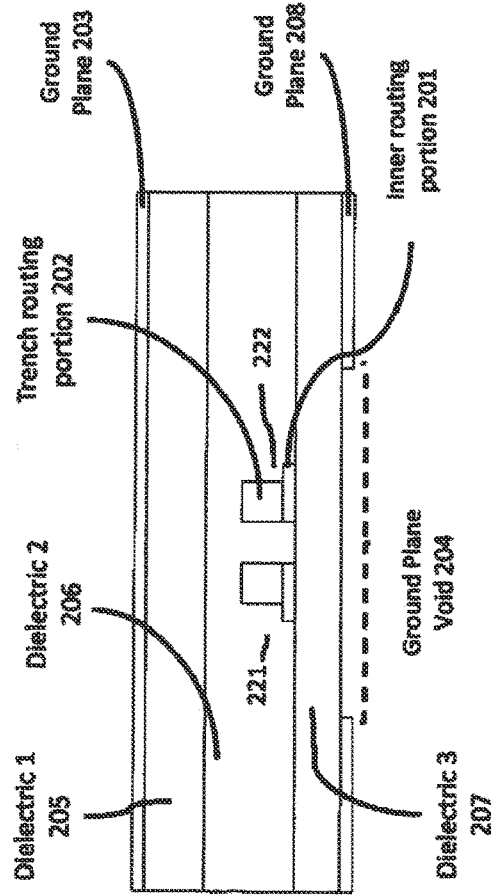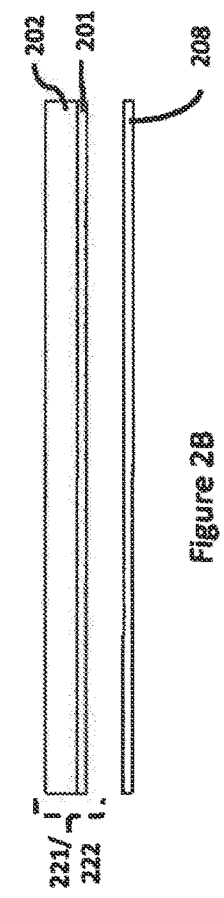

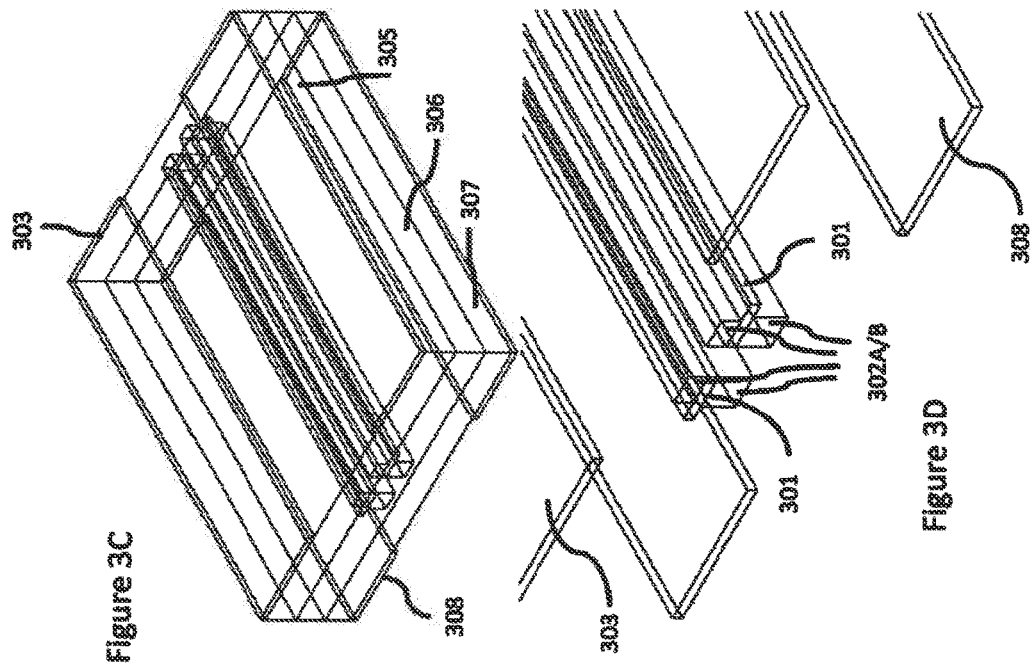
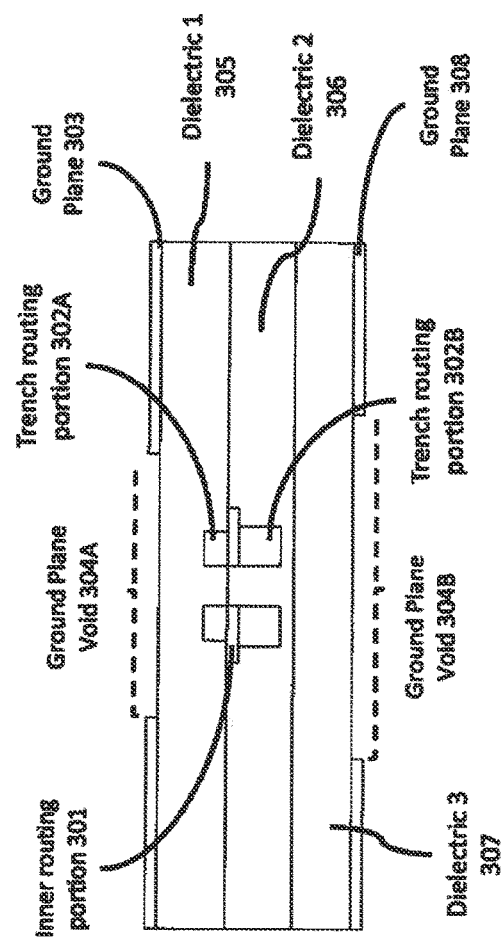
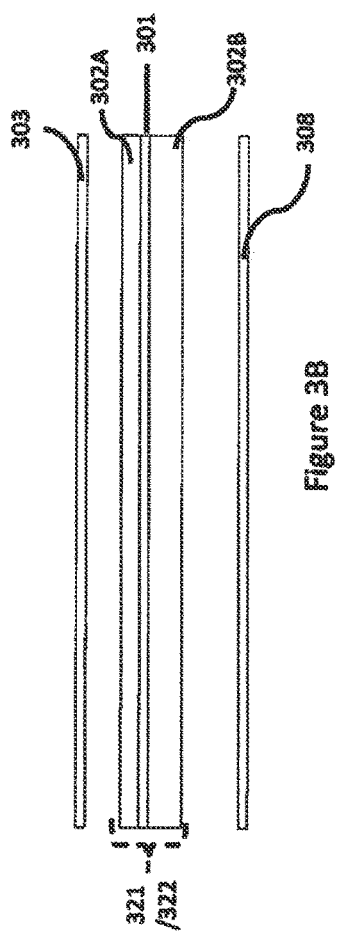

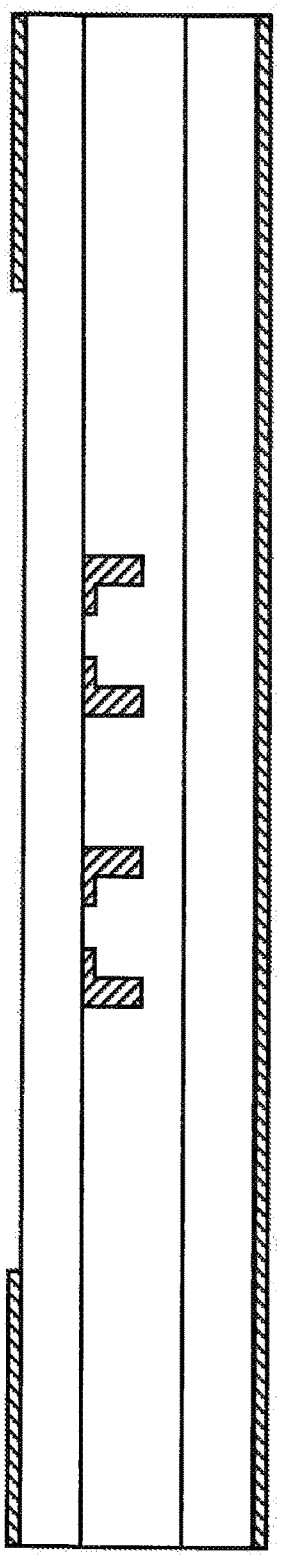
FIG. 4
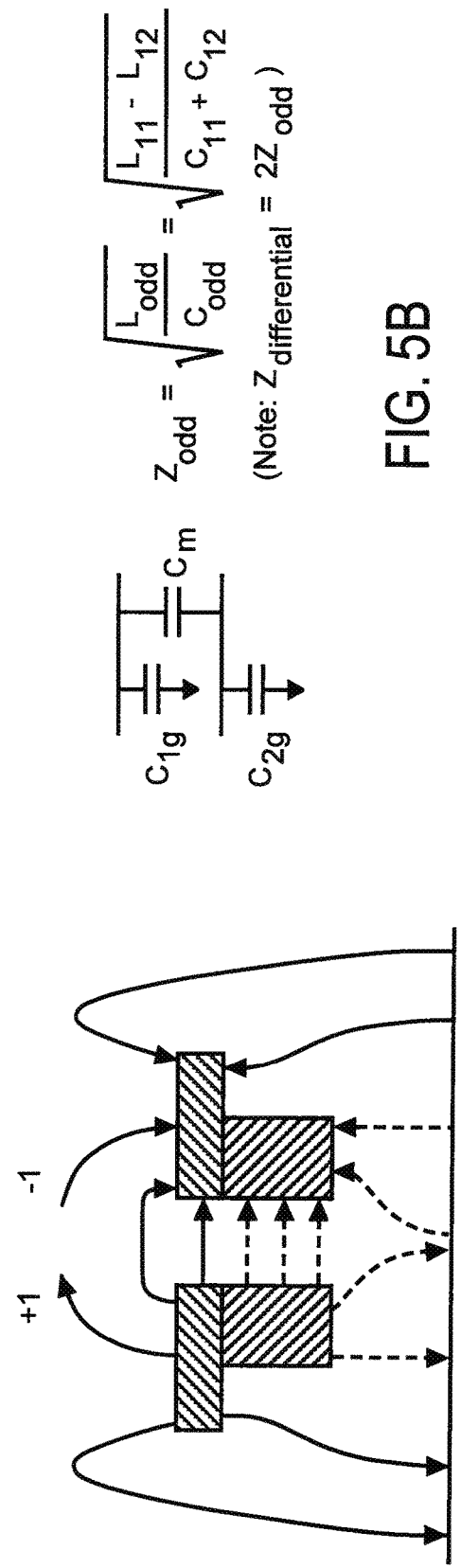
FIG. 5A
$$Z_{odd} = \sqrt{\frac{L_{odd}}{C_{odd}}} = \sqrt{\frac{L_{11} - L_{12}}{C_{11} + C_{12}}}$$
(Note: $Z_{differential} = 2Z_{odd}$)
FIG. 5B

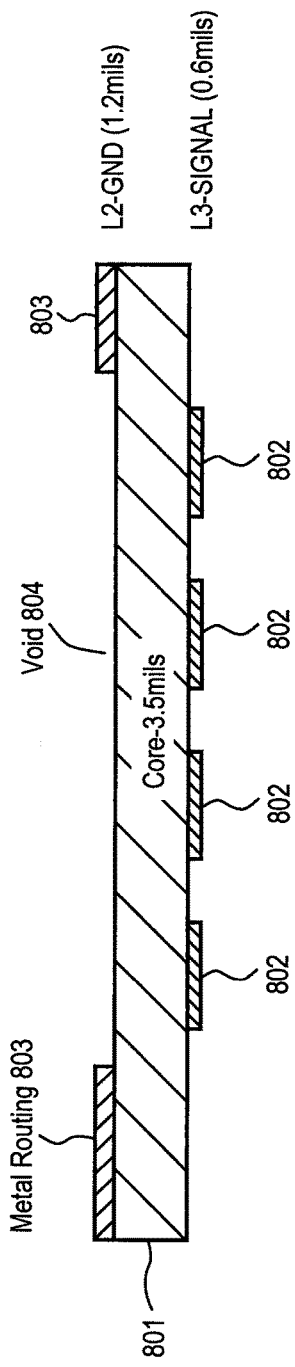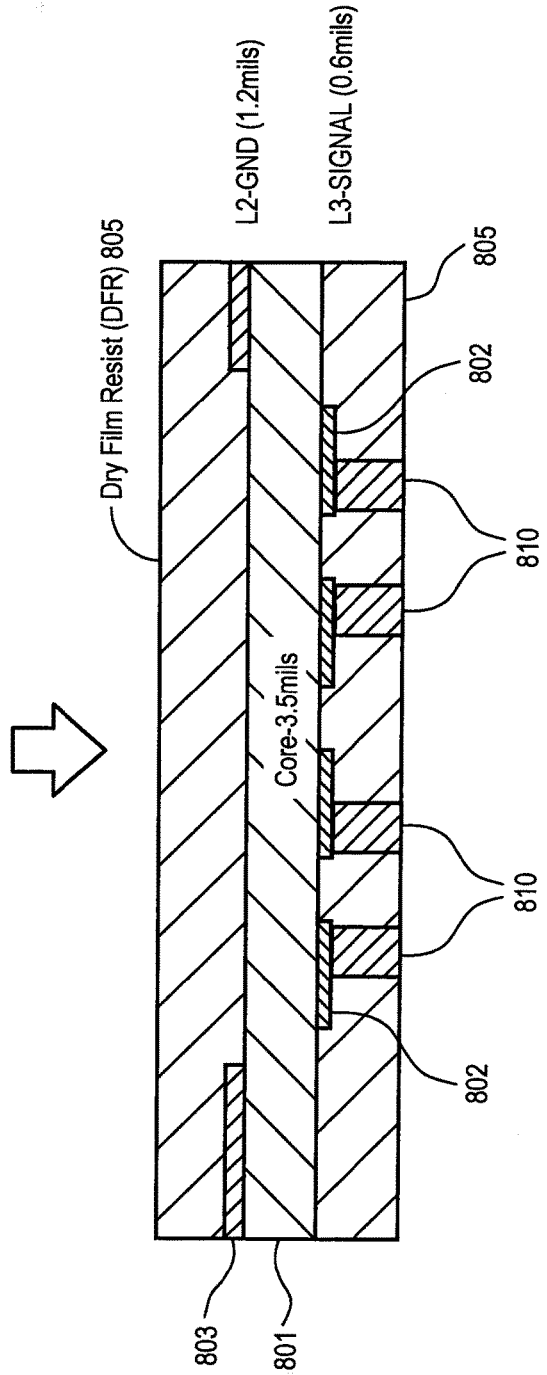
FIG. 8A
FIG. 8B

US 10,079,158 B2

VERTICAL TRENCH ROUTING IN A SUBSTRATE

FIELD OF THE INVENTION

Embodiments of the present invention relate to the field of substrate (e.g., printed circuit board (PCB)) routing; more particularly, embodiments of the present invention relate to substrates that include differential signal pairs in which each conductor includes a trench routing portion that extends from another routing portion.

BACKGROUND OF THE INVENTION

Conventional PCB routing configurations have channel length limitations when used in high speed signaling situations. When conventional routing configurations employ microstrip, stripline or dual stripline for high speed signaling, the platform channel length is usually limited to 7" or less. For example, the Universal Serial Bus (USB) 3.1 channel length based on a dual-stripline in today's Ultrabook™ stack-up is limited to 6" or 7". A channel length larger than this will experience too much PCB loss or require circuit design capability or a costly on-board retimer, both of which increase the bill of materials (BOM) associated with the platform. It is desirable to have longer channel length while avoiding the costs associated with the circuit design complexity (e.g., circuit design validation costs) and inclusion of a retimer, especially since these costs are only going to increase as serial input/output (I/O) data rates increase.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1A illustrates a cross section view of one embodiment of bottom trench routing.

FIG. 1B illustrates a side view of the bottom trench routing of FIG. 1A where the dielectric layers are hidden.

FIG. 1C illustrates a top-side view of the bottom trench routing of FIG. 1A.

FIG. 1D illustrates a close-up view of the bottom trench routing of FIG. 1A with the dielectric layers hidden.

FIG. 2A illustrates a cross section view of one embodiment of top trench routing.

FIG. 2B illustrates a side view of the top trench routing of FIG. 2A where the dielectric layers are hidden.

FIG. 2C illustrates a top-side view of the top trench routing of FIG. 2A.

FIG. 2D illustrates a close-up view of the top trench routing of FIG. 2A with the dielectric layers hidden.

FIG. 3A illustrates a cross section view one embodiment of dual-sided trench routing.

FIG. 3B illustrates a side view of the dual-sided trench routing of FIG. 3A where the dielectric layers are hidden.

FIG. 3C illustrates a top-side view of the dual-sided trench routing of FIG. 3A.

FIG. 3D illustrates a close-up view of the dual-sided trench routing of FIG. 3A with the dielectric layers hidden.

FIG. 4 illustrates one embodiment of a trench routing portion extending at the outer sidewalls.

FIGS. 5A and 5B illustrate differential impedance as influenced by self and mutual capacitance.

FIGS. 8A-E illustrate a trench routing fabrication process.

DETAILED DESCRIPTION

Figure 6:
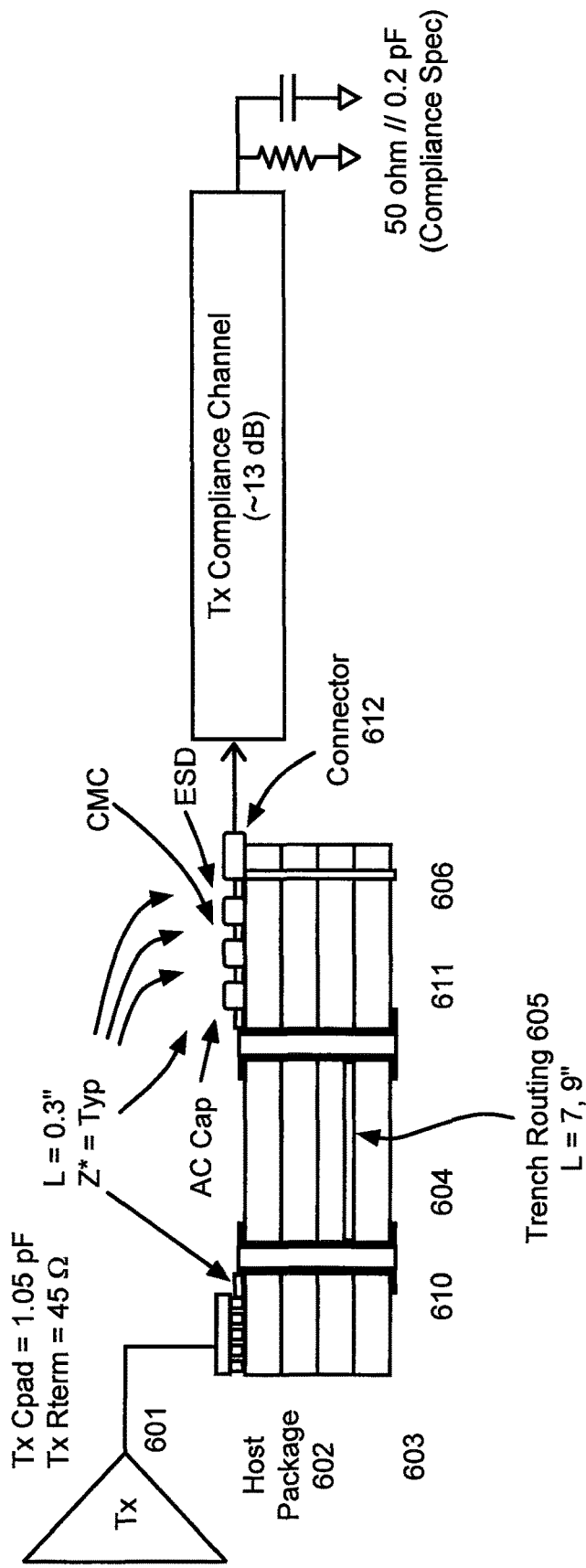
FIG. 6 illustrates one embodiment of a platform using the trench routing described herein.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

A substrate routing scheme that includes the use of trench routing is disclosed. In one embodiment, the substrate is a printed circuit board (PCB). Trench routing is used for signal conductors in a substrate. In one embodiment, the signal conductors are differential signal pairs (D+ and D−). The vertical trench can be designed at the outer or at inner sidewalls of D+ and D− differential signals.

FIGS. 1A-D illustrate one embodiment of bottom trench routing. FIG. 1A illustrates a cross section view of the bottom trench routing. Referring to FIG. 1A, two signal conductors 121 and 122 are shown in a dielectric layer 106. In one embodiment, signal conductors 121 and 122 are metal signal conductors that form a differential signal pair. In one embodiment, each of signal conductors 121 and 122 has a trench routing portion 102 extending from the bottom of inner signal routing portion 101 at the inner sidewall. The width of inner signal routing portion 101 is greater than that of trench routing portion 102. However, the height of trench routing portion 102 is greater than the height of inner signal routing portion 101.

The top side of inner routing portion 101 is flush with the top side of dielectric layer 106 and trench routing portion 102 extends beneath it into dielectric layer 106. Dielectric layer 105 is on top of dielectric layer 106, while dielectric layer 107 is beneath dielectric layer 106. On top of dielectric layer 105 is ground plane layer 103 and below dielectric layer 107 is ground plane layer 108. Ground plane layer 103 is only a partial layer includes a ground plane layer void 104 in which the portion of the ground plane layer above signal conductors 121 and 122 is absent. In one embodiment, the size of the ground plane layer void is 3-5× of conductor trace width, as the distance from the outside edges of the differential signal conductors to the outside edge of the ground plane void, to ensure that the coupling between the ground plane and the conductor is minimal to none.

FIG. 1B illustrates the side view of the bottom trench routing where the dielectric layers are hidden. FIG. 1C illustrates the top-side view of the bottom trench routing. FIG. 1D illustrates a close-up view of the bottom trench routing with the dielectric layers hidden.

FIGS. 2A-D illustrate one embodiment of the top trench routing. FIG. 2A illustrates a cross section view of the top trench routing. Referring to FIG. 2A, two signal conductors 221 and 222 are shown in a dielectric layer 206. In one embodiment, signal conductors 221 and 222 are metal signal conductors that form a differential signal pair. In one embodiment, each of signal conductors 221 and 222 has a trench routing portion 202 extending up from the top of inner signal routing portion 201 at the inner sidewall. The width of inner signal routing portion 201 is greater than that of trench routing portion 202. However, the height of trench routing portion 202 is greater than the height of inner signal routing portion 201.

The bottom side of inner routing portion 201 is flush with the bottom side of dielectric layer 206 and trench routing portion 202 extends above it into dielectric layer 206. Dielectric layer 205 is on top of dielectric layer 206, while dielectric layer 207 is beneath dielectric layer 206. On top of dielectric layer 205 is ground layer 203 and a ground layer 208 is beneath dielectric layer 207. Ground layer 208 is only a partial ground plane larger and includes a ground plane layer void 204 below signal conductors 221 and 222.

FIG. 2B illustrates the side view of the top trench routing where the dielectric layers are hidden. FIG. 2C illustrates the top-side view of the top trench routing. FIG. 2D illustrates a close-up view of the top trench routing with the dielectric layers hidden.

FIGS. 3A-D illustrate one embodiment of dual-sided trench routing that extends from both sides of an inner routing portion. FIG. 3A illustrates a cross section view of the dual-sided trench routing. Referring to FIG. 3A, two signal conductors 321 and 322 are shown. In one embodiment, signal conductors 321 and 322 are metal signal conductors that form a differential signal pair. In one embodiment, each of signal conductors 321 and 322 has a trench routing portion 302A extending up from the top of inner signal routing portion 301 and a trench routing portion 302B extending down from the bottom of inner signal routing portion 301, where extending occurs at the inner sidewall. Ground plane layer 303 is only a partial layer and includes a ground plane void 304A above signal conductors 321 and 322. Ground plane layer 308 is only a partial layer and includes a ground plane layer void 304B below signal conductors 321 and 322.

The top side of inner routing portion 301 is flush with the top side of dielectric layer 306 and trench routing portion 302A extends above it into dielectric layer 305, while trench routing portion 302B extends below it into dielectric layer 306. Ground plane 303 is above dielectric layer 305 and ground plane layer 308 is below dielectric layer 307.

FIG. 3B illustrates the side view of the dual-sided trench routing where the dielectric layers are hidden. FIG. 3C illustrates the top-side view of the dual-sided trench routing. FIG. 3D illustrates a close-up view of the dual-sided trench routing with the dielectric layers hidden.

The routing schemes disclosed in FIGS. 1A-D, 2A-D, and 3A-D are better than conventional PCB routing configurations, by providing a length extension in the platform design. For instance, only 6-7" of USB 3.1 channel length can be supported based on dual-stripline (DSL) in today's Ultrabook™ stack-up. With the vertical trench routing disclosed herein, up to 9" of length is achievable. This also helps to remove the costly on-board retimer thereby reducing in bill of materials (BOM) cost.

Note that in the plurality of FIGS. 1A-D, 2A-D, and 3A-D, the trench routing portion extends at the inner sidewalls of the D+ and D− differential signals. In one embodiment, the trench routing portion can extend at the outer sidewalls, such as shown, for example in FIG. 4.

In one embodiment, the routing scheme is a low-loss PCB routing scheme that provides longer platform length within the same interconnect channel loss budget. The routing techniques described herein enable the removal of a retimer in certain routing configurations, such as, for example, 10 Gbps USB 3.1 channel, which may be needed if conventional routing configurations such as microstrip, stripline and dual-stripline are employed on platforms, and for enabling long platform length (>7"). In one embodiment, use of the routing techniques described herein provides up to an additional 4" and 2" in channel length for USB3 Gen1 and Gen2, respectively.

In one embodiment, the routing scheme described herein addresses and reduces the impact of the skin effect, which is becoming more and more significant as serial I/O data rates increase. By using vertical trench routing, the skin depth, which is the high current density area, can be more distributed along the vertical sidewall of differential (D+ and D−) signals. This reduces the alternating current (AC) resistance, thereby contributing to lower PCB loss.

By applying the disclosed routing scheme to other high-speed input/output (TO) buses, such as Universal Serial Bus (USB), Peripheral Component Interconnect Express (PCIe) or Serial AT Attachment (SATA), circuit design complexity (e.g., equalization, etc.) can be reduced, which can provide savings in die area. The efforts needed for circuit design validation can also be reduced substantially too.

The trench thickness and width are two parameters that are controlled to achieve the target impedance of differential signaling. FIGS. 5A and 5B illustrate differential impedance as influenced by self and mutual capacitance. The impedance is given according to the following formula:

$$Z_{odd} = \sqrt{\frac{L_{odd}}{C_{odd}}} = \sqrt{\frac{L_{11} - L_{12}}{C_{11} + C_{12}}}$$

While creating vertical trench reduces the skin depth and alternating current (AC) loss, the mutual capacitance ($C_m$ or $C_{12}$) increases accordingly, thereby leading to reduction of target impedance. To counteract it, the self-capacitance ($C_{1g}$, $C_{2g}$ or $C_{11}$) is reduced. This is achieved by use of reducing the trench width. In one embodiment, trench 102 is of reduced width in comparison with trace routing width 101. In one embodiment, the width of the trench is between 50-70% the width of the trace routing (which is approximately 4 mils in width).

Knowing that PCB loss or length is the main contributor to the eye height (EH) margin, subsequent analysis has been conducted to ascertain the benefits by employing the aforementioned vertical trench routing. The techniques described herein are capable of saving close to 20% of differential insertion loss (DDIL) per inch. The maximum AC current density in trench routing can be found to be only two-third of that in DSL (around $1 \times 10^{-4}$ A/m vs. $1.5 \times 10^{-4}$ A/m).

FIG. 6 illustrates one embodiment of a platform using the trench routing described herein. Referring to FIG. 6, a processor integrated circuit (IC) 602 with a transmitter (Tx) 601 is attached to a PCB 603. Trench routing signal conductors 605 above layer 604 are coupled to signals on host package 602 using via 610 and to connector 612 using via 611. Connector 612 is coupled to another end of PCB 606. In one embodiment, trench routing signal conductors 605 are 7" in length. With the DSL at 7", an eye margin of 90.5 mV and 51.3 ps is observed for the Tx compliance analysis. In another embodiment, trench routing signal conductors are 9" in length. A similar eye margin can still be attained with the trench routing disclosed herein, even at 9" board length. This indeed represents a significant 2" length extension, which could translate into board design flexibility, USB 3.1 retimer removal, and/or circuit design complexity reduction.

Figure 7:
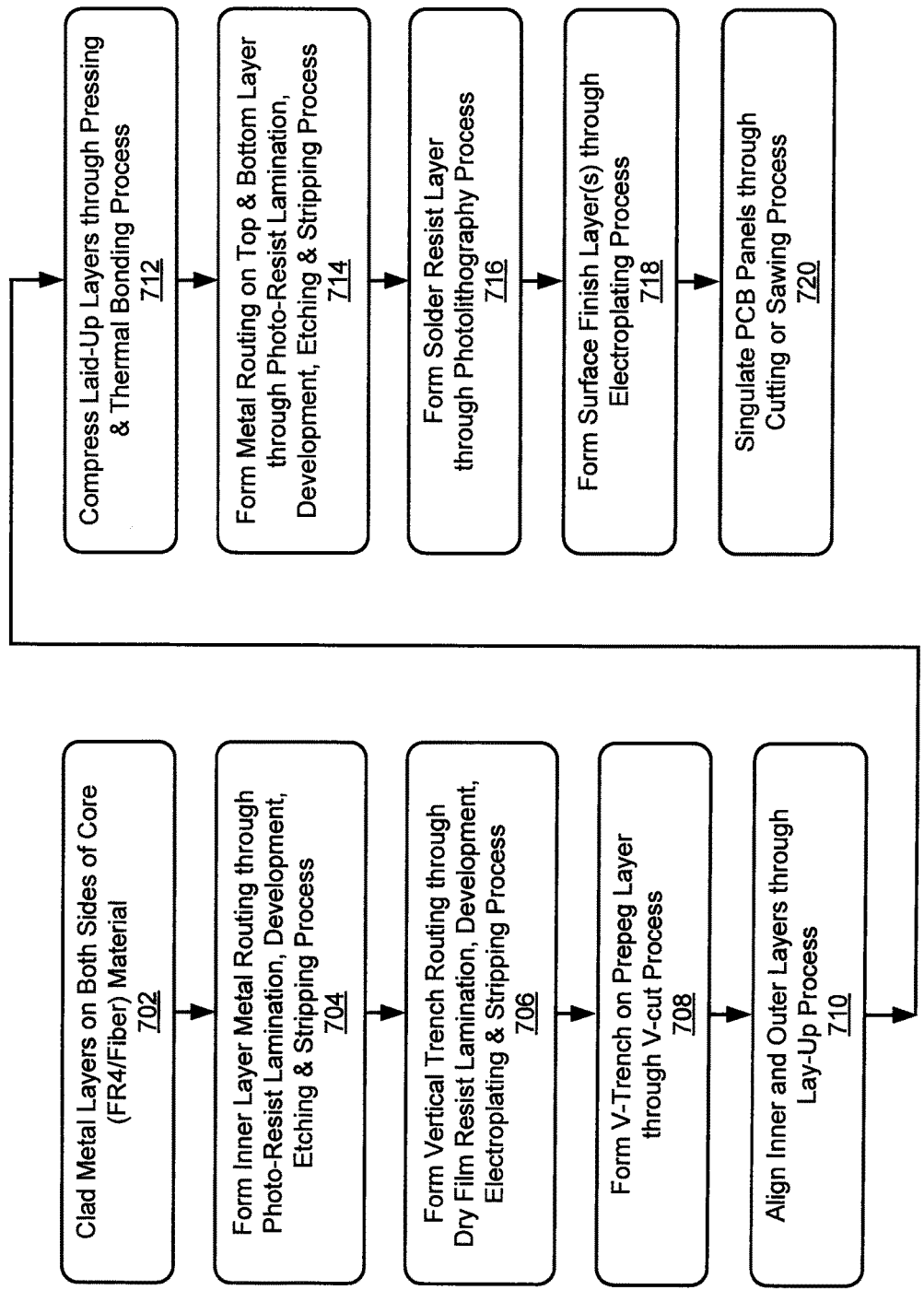
FIG. 7 illustrates one embodiment of a process for fabricating the vertical trench routing.

FIG. 7 is one embodiment of a process for fabricating the vertical trench routing. Referring to FIG. 7, the process begins by cladding metal layers e.g. copper foils on both sides of a core material (process block 702). In one embodiment, the core material is made of composite material composed of woven fiberglass cloth with epoxy resin binder that is flame resistant (FR4).

Next, the process includes forming an interlayer metal routing through a photo-resist lamination, development, etching and stripping process (process block 704).

FIG. 8A illustrates layers after the inner layer fabrication process that includes a copper cladding process and a photo-resist lamination, development, etching and stripping process. Referring to FIG. 8A, a layer two (L2) ground layer with metal routing 803 on the top side of core layer 801. The L2 ground layer also includes a void area 804 which corresponds to the ground plane void discussed above. In one embodiment, the L2 ground layer is 1.2 mils thick. Inner metal layers 802 are shown on the bottom of core layer 801. Inner layer metal portions 802 are part of a L3 signal layer. In one embodiment, the L3 signal layer is 0.6 mils thick.

Referring back to FIG. 7, after forming the inner layer metal routing, the process forms a vertical trench routing through a dry film resist (DFR) lamination, development, electroplating and stripping process (process block 706).

FIG. 8B illustrates a trench routing fabrication process. In one embodiment, this processing is a photo-resist lamination, development, etching, electroplating and stripping process. Referring to FIG. 8B, trench routing portions 810 are shown next to the previously fabricated inner metal routing 802. The trench routing is formed in a dry film resist (DFR) layer 805 that has been laminated onto the results of the inner layer fabrication shown in FIG. 8A. Note that in FIG. 8B, trench routing portions 810 are shown after the DFR development (exposure) process. Trench routing portions 810 undergo the electroplating process and are electrically connected to inner layer metal portions 802.

Referring back to FIG. 7, once the vertical trench routing has been formed, the process forms of V-trench on a prepreg layer through a V-cut process (process block 708) and the inner and outer layers are aligned through a layup process (process block 710). Prepreg layers are well-known in the art. The process then compresses the laid up layers through a pressing and thermal bonding process (process block 712).

Figure 8C:
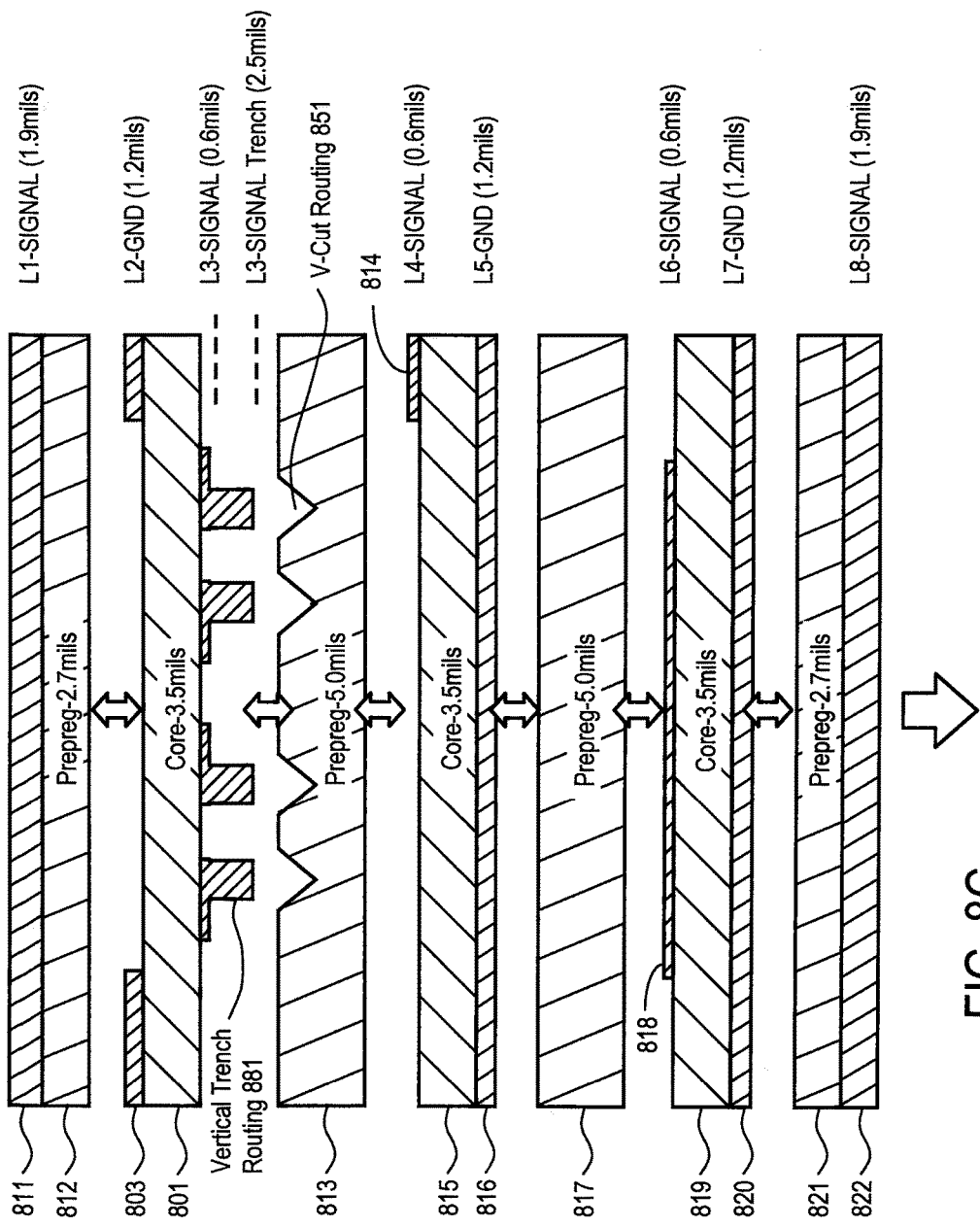

FIG. 8C illustrates the lay-up and bonding process. Referring to FIG. 8C, the forward DFR layer is removed from core layer 801 to reveal vertical trench routing 881. A prepreg layer 813 prepared with V-cut routing 851 is aligned with vertical trench routing 881. In one embodiment, the length of vertical trench routing 881 is 2.5 mils thick, inner signal routing 802 is 0.6 mils thick, and prepreg layer 813 is 5.0 mils thick.

Other layers are also prepared and aligned with core layer 801 and prepreg layer 813. These includes a layer one (L1) signal layer 811 that is attached to a prepreg layer 812. In one embodiment, L1 signal layer 811 is 1.9 mils thick, while prepreg layer 812 is 2.7 mils thick. A layer four (L4) signal layer 814 is formed on top of core layer 815. A layer five (L5) ground plane layer 816 is formed on the bottom of core layer 815. In one embodiment, L4 signal layer 814 is 0.6 mils thick, core layer 815 is 3.5 mils thick, and L5 ground plane layer is 1.2 mils thick. A prepreg layer 817 is aligned below L5 ground plane layer 816. In one embodiment, prepreg layer 817 is 5.0 mils thick. A layer six (L6) signal layer 818 is formed on top of core layer 819 and is aligned below prepreg layer 817. A layer seven (L7) ground plane layer 820 is formed on the bottom of core layer 819. In one embodiment, L6 signal layer is 0.6 mils thick, core layer 819 is 3.5 mils thick and L7 ground plane layer 820 is 1.2 mils thick. A prepreg layer 821 with a layer eight (L8) signal layer 822 formed on its bottom is aligned with L7 ground layer 820. In one embodiment, prepreg layer 821 is 2.7 mils thick and L8 signal layer 822 is 1.9 mils thick.

The layers shown in FIG. 8C are compressed together at a predetermined pressure and temperature to form a single structure in which vertical trench routing 881 is pressed into V-cut routing 851. In one embodiment, the pressure is 15 Pascal and the temperature is 185 degrees Celsius.

Referring back to FIG. 7, after compressing the laid up layers, the process forms metal routing on the top and bottom layers through a photo-resist lamination, development, etching and stripping process (process block 714).

Figure 8D:
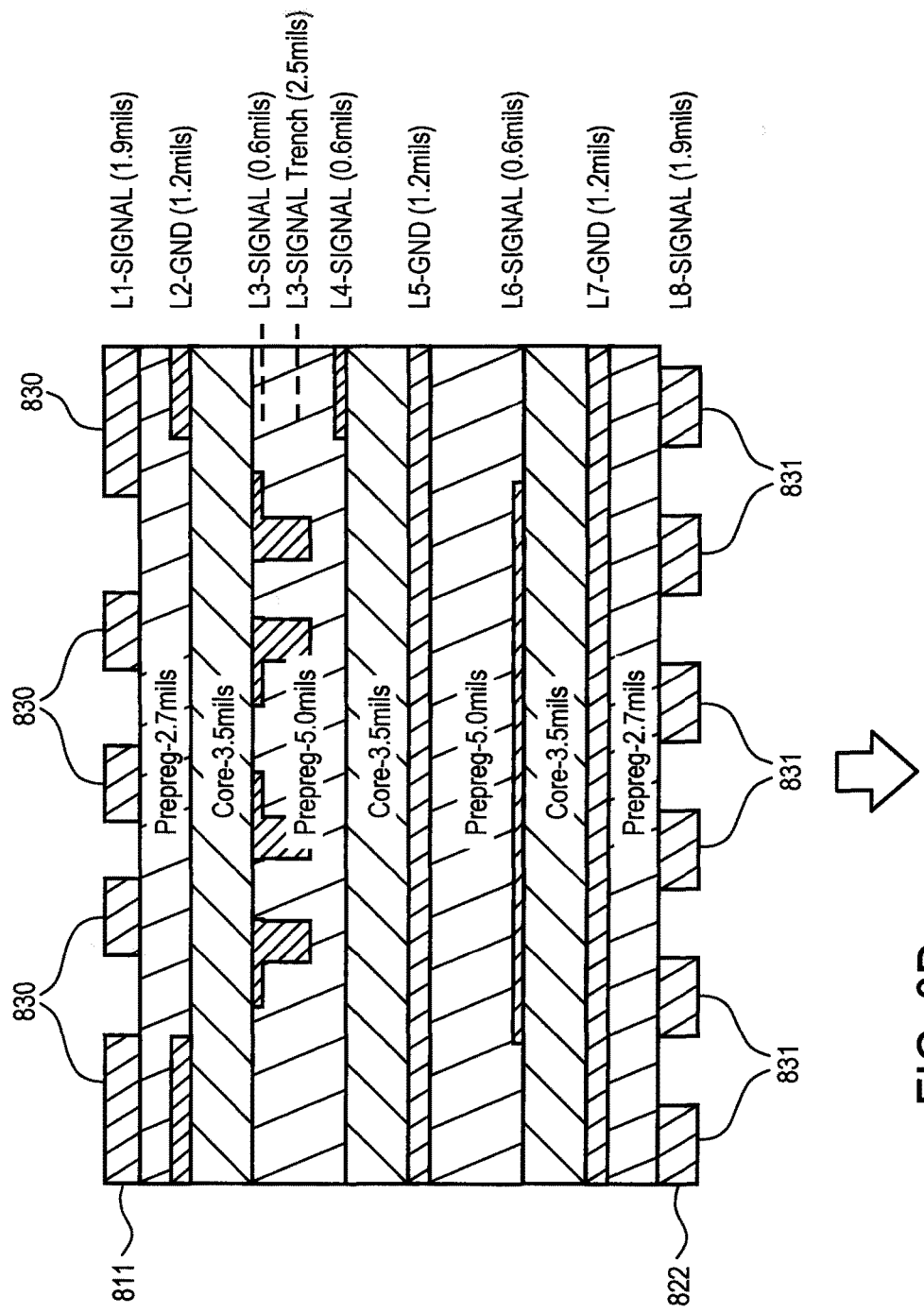

FIG. 8D illustrates the top (L1) and bottom (L8) metallization. Referring to FIG. 8D, the metallization is a result of the photo-resist lamination, development, etching and stripping process. The result of the process is metal lines 830 being formed in L1 signal layer 811 and metal lines 831 being formed in L8 signal layer 822.

Referring back to FIG. 7, after forming the metal routing, the process forms the solder resist (SR) layer through a photolithography process (process block 716) and forms one or more surface finish layers through an electroplating process (process block 718).

Figure 8E:
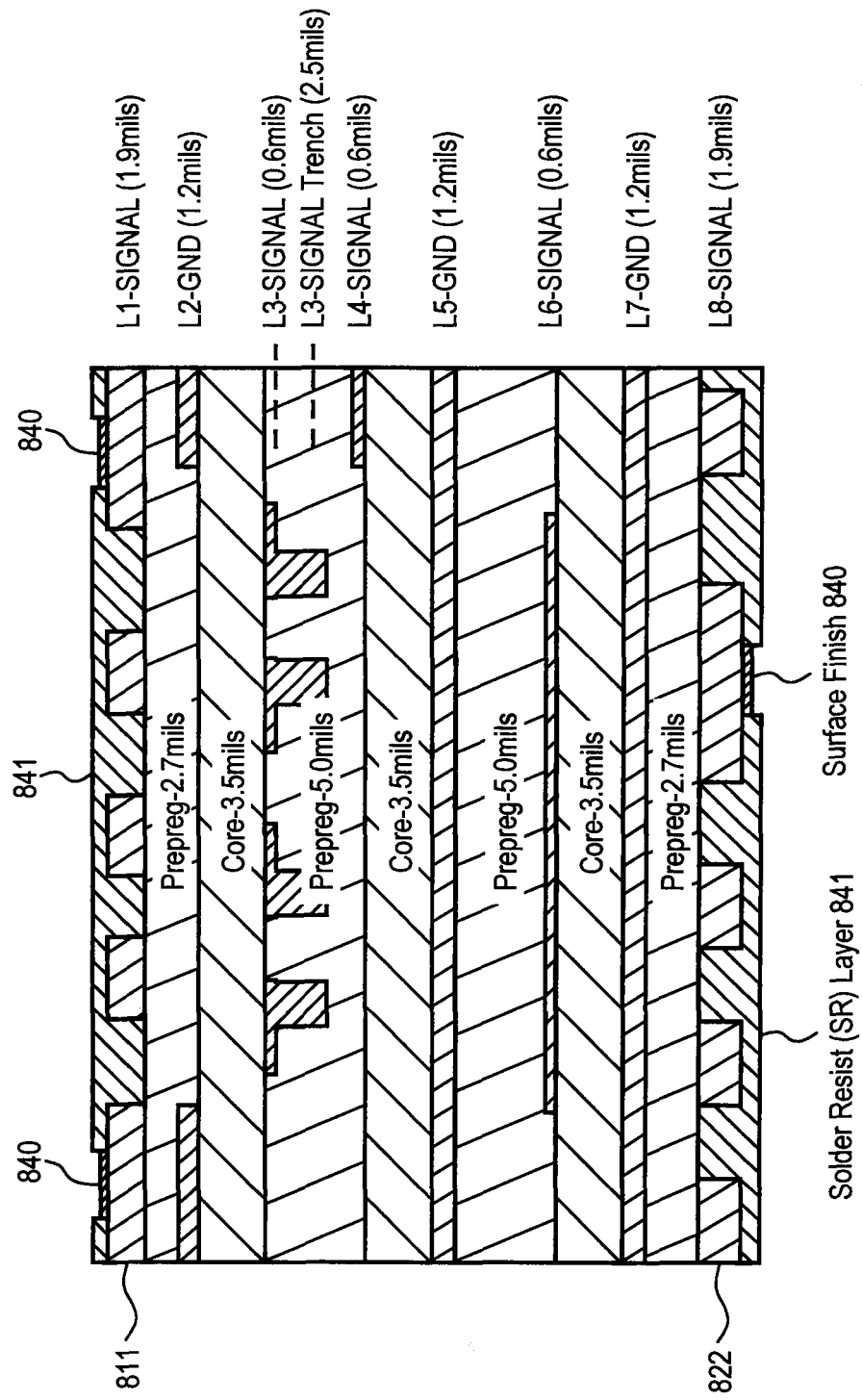

FIG. 8E illustrates a solder resistant surface finish process. Referring to FIG. 8E, the process includes a SR lamination development, etching and electroplating process. The results of the process are a SR layer 841 being formed on top of both the metal lines from L1 signal layer 811 and metal lines 830 in L8 signal layer 822. Also in SR layer 841, there are a number of surface finishes 840 that are fabricated into the surface finish layer.

Finally, the process singulates PCB panels through a cutting or sawing process (process block 720).

Figure 9:
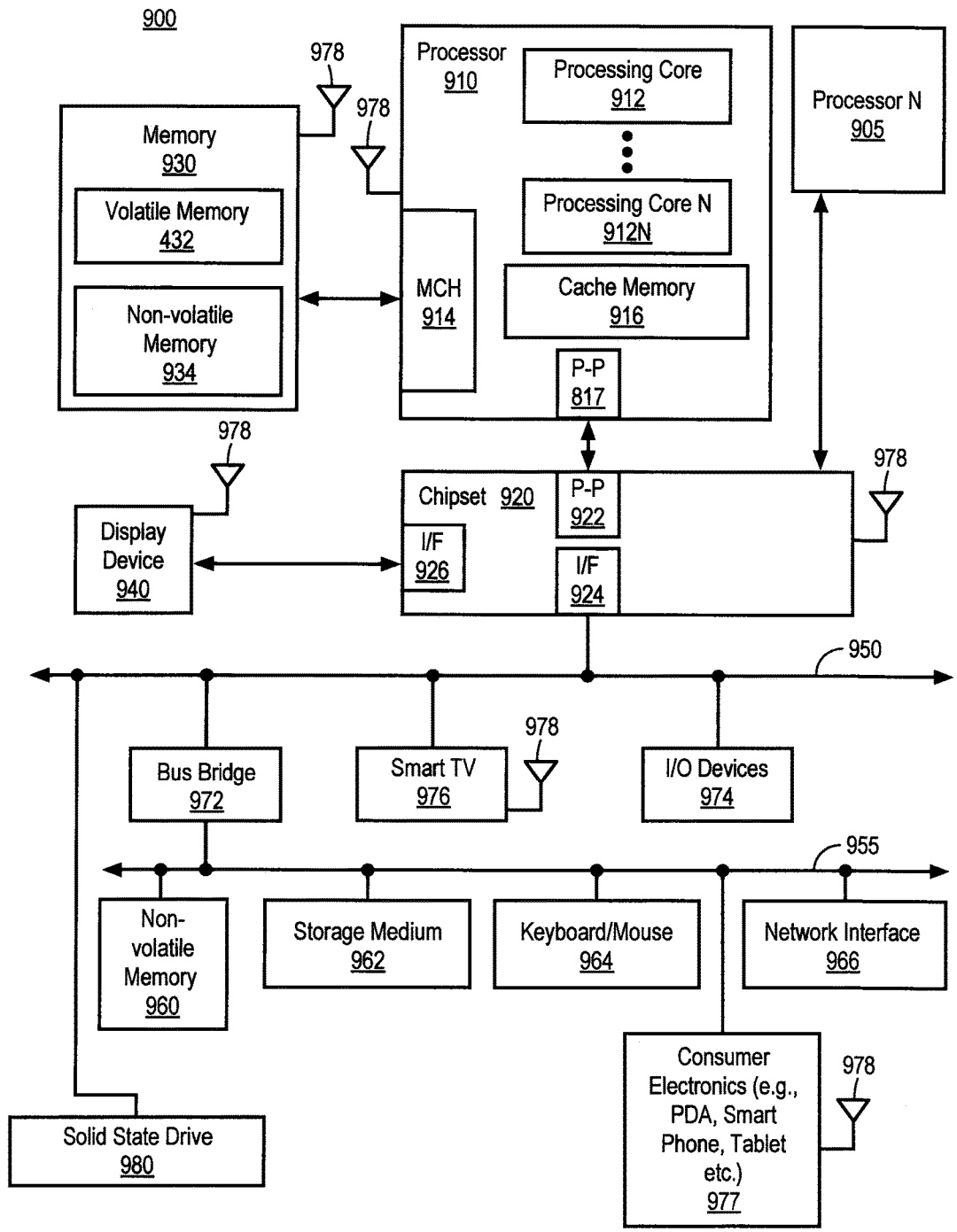
FIG. 9 is a block diagram of one embodiment of a system.

FIG. 9 is one embodiment of a system level diagram 900 comprising one or more interconnects that may use the interconnect topology with the vertical trench routing described above. Referring to FIG. 9, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, system 900 implements the methods disclosed herein and may be a system on a chip (SOC) system.

In one embodiment, processor 910 has one or more processor cores 912 to 912N, where 912N represents the Nth processor core inside the processor 910 where N is a positive integer. In one embodiment, system 900 includes multiple processors including processors 910 and 905, where processor 905 has logic similar or identical to logic of processor 910. In one embodiment, system 900 includes multiple processors including processors 910 and 905 such that processor 905 has logic that is completely independent from the logic of processor 910. In such an embodiment, a multi-package system 900 is a heterogeneous multi-package system because the processors 905 and 910 have different logic units. In one embodiment, processing core 912 includes, but is not limited to, pre-fetch logic to fetch instructions, decode logic to decode the instructions, execution logic to execute instructions and the like. In one embodiment, processor 910 has a cache memory 916 to cache instructions and/or data of the system 900. In another embodiment of the invention, cache memory 916 includes level one, level two and level three, cache memory, or any other configuration of the cache memory within processor 910.

In one embodiment, processor 910 includes a memory control hub (MCH) 914, which is operable to perform functions that enable processor 910 to access and communicate with a memory 930 that includes a volatile memory 932 and/or a non-volatile memory 934. In one embodiment, memory control hub (MCH) 914 is positioned outside of processor 910 as an independent integrated circuit.

In one embodiment, processor 910 is operable to communicate with memory 930 and a chipset 920. In such an embodiment, SSD 980 executes the computer-executable instructions when SSD 980 is powered up.

In one embodiment, processor 910 is also coupled to a wireless antenna 978 to communicate with any device configured to transmit and/or receive wireless signals. In one embodiment, wireless antenna interface 978 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory (e.g., NAND, NOR), phase change memory (PCM), read-only memory (ROM), electrically erasable programmable read-only memory (EEPROM), or any other type of non-volatile memory device.

Memory 930 stores information and instructions to be executed by processor 910. In one embodiment, chipset 920 connects with processor 910 via Point-to-Point (PtP or P-P) interfaces 917 and 922. In one embodiment, chipset 920 enables processor 910 to connect to other modules in the system 900. In one embodiment, interfaces 917 and 922 operate in accordance with a PtP communication protocol such as the Intel QuickPath Interconnect (QPI) or the like.

In one embodiment, chipset 920 is operable to communicate with processor 910, 905, display device 940, and other devices 972, 976, 974, 960, 962, 964, 966, 977, etc. In one embodiment, chipset 920 is also coupled to a wireless antenna 978 to communicate with any device configured to transmit and/or receive wireless signals.

In one embodiment, chip set 920 connects to a display device 940 via an interface 926. In one embodiment, display device 940 includes, but is not limited to, liquid crystal display (LCD), plasma, cathode ray tube (CRT) display, or any other form of visual display device. In addition, chipset 920 connects to one or more buses 950 and 955 that interconnect various modules 974, 960, 962, 964, and 966. In one embodiment, buses 950 and 955 may be interconnected together via a bus bridge 972 if there is a mismatch in bus speed or communication protocol. In one embodiment, chipset 920 couples with, but is not limited to, a non-volatile memory 960, a mass storage device(s) 962, a keyboard/mouse 964, and a network interface 966 via interface 924, smart TV 976, consumer electronics 977, etc.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface.

While the modules shown in FIG. 9 are depicted as separate blocks within the system 900, the functions performed by some of these blocks may be integrated within a single semiconductor circuit or may be implemented using two or more separate integrated circuits.

In a first example embodiment, an electrical interconnect comprises a substrate having a plurality of layers including a first ground plane layer; a pair of signal conductors that form a differential signal pair, each conductor of the pair of signal conductors having a first portion and a second portion, where the second portion extends from the first portion into at least one of the plurality of layers, and where the width of the second portion is less than width of the first portion; and where the first ground plane layer is only a first partial layer and has a first void region that is closer to the pair of signal conductors than the first partial layer.

In another example embodiment, the subject matter of the first example embodiment can optionally include that length of second portion is greater than length of the first portion.

In another example embodiment, the subject matter of the first example embodiment can optionally include that the second portion extends below the first portion and the void region is above the first portion. In another example embodiment, the subject matter of this additional example embodiment can optionally include that the plurality of layers includes a second ground plane layer that is below the second portion in the substrate.

In another example embodiment, the subject matter of the first example embodiment can optionally include that the second portion extends above the first portion and the void region is below the first portion. In another example embodiment, the subject matter of this additional example embodiment can optionally include that the plurality of layers includes a second ground plane layer that is above the second portion in the substrate.

In another example embodiment, the subject matter of the first example embodiment can optionally include that the plurality of layers includes a second ground plane layer, the second ground plane layer being only a second partial layer and has a second void region that is closer to the pair of signal conductors than the second partial layer, that the second portion extends below the first portion and the first void region is above the first portion and each of the pair of signal conductors includes a third portion extending above the first portion, and that the first and second void regions being above and below the first portion.

In another example embodiment, the subject matter of the first example embodiment can optionally include that the first and second portions of the pair of signal conductors are contained within a first dielectric layer in the plurality of layers. In another example embodiment, the subject matter of this additional example embodiment can optionally include that the plurality of layers includes a second dielectric layer that abuts the first dielectric layer and the first portion of each of the plurality of signal conductors or that the pair of signal conductors are contained within a first dielectric layer in the plurality of layers In a second example embodiment, an electrical interconnect comprises: a substrate having a plurality of layers including a first ground plane layer, a first dielectric layer and a second dielectric layer, a surface of the second dielectric layer abutting a surface of the first dielectric layer; a pair of signal conductors in the first dielectric layer and that form a differential signal pair, each conductor of the pair of signal conductors having a first portion and a second portion, a first side of the first portion of each of the plurality of signal conductors abutting the second dielectric layer, the second portion extending into at least one of the plurality of layers from a second side of the first portion, the second side being opposite the first side on the first portion, wherein width of the second portion is less than width of the first portion; and wherein the first ground plane layer is only a first partial layer and has a first void region that is closer to the pair of signal conductors than the first partial layer.

In another example embodiment, the subject matter of the second example embodiment can optionally include that length of second portion is greater than length of the first portion.

In another example embodiment, the subject matter of the second example embodiment can optionally include that the second portion extends below the first portion and the void region is above the first portion and the second dielectric layer.

In another example embodiment, the subject matter of the second example embodiment can optionally include that the plurality of layers includes a second ground plane layer that is below the second portion in the substrate.

In another example embodiment, the subject matter of the second example embodiment can optionally include that the second portion extends above the first portion and the void region is below the first portion and the second dielectric layer. In another example embodiment, the subject matter of this additional example embodiment can optionally include that the plurality of layers includes a second ground plane layer that is above the second portion in the substrate.

In another example embodiment, the subject matter of the second example embodiment can optionally include that the plurality of layers includes a second ground plane layer, the second ground plane layer being only a second partial layer and has a second void region that is closer to the pair of signal conductors than the second partial layer; that the second portion extends below the first portion and the first void region is above the first portion and each of the pair of signal conductors includes a third portion extending above the first portion; and that the first and second void regions being above and below the first portion.

In a third example embodiment, a method for fabricating signal conductors with vertical trench routing comprises: forming a first metal routing portion on a first layer; forming a pair of signal conductors, the pair of signal conductors being a differential signal pair, each conductor of the pair of signal conductors being formed by forming a second metal routing portion that extends from the first metal routing portion into a second layer, the second layer different than the first layer, wherein width of the second metal routing portion is less than width of the first metal routing portion; and forming a first ground plane layer that comprises only a first partial layer and has a first void region that is closer to the pair of signal conductors than the first partial layer.

In another example embodiment, the subject matter of the third example embodiment can optionally include that forming a pair of signal conductors comprises forming vertical trench routing in which a plurality of vertical trench portions protrude from first metal routing portion using a photo-resist lamination, development, etching, electroplating and stripping process.

In another example embodiment, the subject matter of the third example embodiment can optionally include forming a second layer with vertical trench regions in a third layer, aligning vertical trenches of the plurality of vertical trenches with vertical trench portions, and combining the first, second and third layers.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An electrical interconnect comprising:
    a substrate having a plurality of layers including a first ground plane layer;
    a pair of signal conductors that form a differential signal pair, each conductor of the pair of signal conductors having a first portion for inner signal routing and a second portion for trench routing, the second portion extending from the first portion into at least one of the plurality of layers, wherein the second portion is below the first portion and the width of the second portion is less than width of the first portion; and
    wherein the first ground plane layer is only a first partial layer and has a first void region that is closer to the pair of signal conductors than the first partial layer.

2. The electrical interconnect defined in claim 1 wherein length of second portion is greater than length of the first portion.

3. The electrical interconnect defined in claim 1 wherein the second portion extends below the first portion and the void region is above the first portion.

4. The electrical interconnect defined in claim 3 wherein the plurality of layers includes a second ground plane layer that is below the second portion in the substrate.

5. The electrical interconnect defined in claim 1 wherein the second portion extends above the first portion and the void region is below the first portion.

6. The electrical interconnect defined in claim 5 wherein the plurality of layers includes a second ground plane layer that is above the second portion in the substrate.

7. The electrical interconnect defined in claim 1 wherein:
    the plurality of layers includes a second ground plane layer, the second ground plane layer being only a second partial layer and has a second void region that is closer to the pair of signal conductors than the second partial layer;
    the second portion extends below the first portion and the first void region is above the first portion and each of the pair of signal conductors includes a third portion extending above the first portion; and
    the first and second void regions being above and below the first portion.

8. The electrical interconnect defined in claim 1 wherein the first and second portions of the pair of signal conductors are contained within a first dielectric layer in the plurality of layers.

9. The electrical interconnect defined in claim 8 wherein the plurality of layers includes a second dielectric layer that abuts the first dielectric layer and the first portion of each of the plurality of signal conductors.

10. The electrical interconnect defined in claim 1 wherein the pair of signal conductors are contained within a first dielectric layer in the plurality of layers.

11. An electrical interconnect comprising:
    a substrate having a plurality of layers including a first ground plane layer, a first dielectric layer and a second dielectric layer, a surface of the second dielectric layer abutting a surface of the first dielectric layer;
    a pair of signal conductors in the first dielectric layer and that form a differential signal pair, each conductor of the pair of signal conductors having a first portion for inner signal routing and a second portion for trench routing, a first side of the first portion of each of the plurality of signal conductors abutting the second dielectric layer, the second portion extending into at least one of the plurality of layers from a second side of the first portion, the second side being opposite the first side on the first portion, wherein second portion is below the first portion and the width of the second portion is less than width of the first portion; and wherein the first ground plane layer is only a first partial layer and has a first void region that is closer to the pair of signal conductors than the first partial layer.

12. The electrical interconnect defined in claim 11 wherein length of second portion is greater than length of the first portion.

13. The electrical interconnect defined in claim 11 wherein the second portion extends below the first portion and the void region is above the first portion and the second dielectric layer.

14. The electrical interconnect defined in claim 13 wherein the plurality of layers includes a second ground plane layer that is below the second portion in the substrate.

15. The electrical interconnect defined in claim 11 wherein the second portion extends above the first portion and the void region is below the first portion and the second dielectric layer.

16. The electrical interconnect defined in claim 15 wherein the plurality of layers includes a second ground plane layer that is above the second portion in the substrate.

17. The electrical interconnect defined in claim 11 wherein:

the plurality of layers includes a second ground plane layer, the second ground plane layer being only a second partial layer and has a second void region that is closer to the pair of signal conductors than the second partial layer;

the second portion extends below the first portion and the first void region is above the first portion and each of the pair of signal conductors includes a third portion extending above the first portion; and the first and second void regions being above and below the first portion.

* * * * *